US008023662B2

(12) United States Patent

Mitsuhashi et al.

(10) Patent No.: US 8,023,662 B2

(45) Date of Patent: Sep. 20, 2011

(54) REVERBERATION ADJUSTING APPARATUS, REVERBERATION CORRECTING METHOD, AND SOUND REPRODUCING SYSTEM

(75) Inventors: Takashi Mitsuhashi, Tsurugashima (JP); Yoshiki Ohta, Tsurugashima (JP); Teruo Baba, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 1294 days.

(21) Appl. No.: 11/631,493

(22) PCT Filed: Jul. 5, 2005

(86) PCT No.: PCT/JP2005/012362

§ 371 (c)(1),
(2), (4) Date: Jan. 4, 2007

(87) PCT Pub. No.: WO2006/004099

PCT Pub. Date: Jan. 12, 2006

(65) Prior Publication Data

US 2008/0019535 A1 Jan. 24, 2008

(30) Foreign Application Priority Data

Jul. 5, 2004 (JP) ................................ 2004-198295

(51) Int. Cl.

*H04B 3/20* (2006.01)
*H04R 29/00* (2006.01)
*H03G 3/00* (2006.01)

(52) U.S. Cl. .............................. 381/66; 381/56; 381/63

(58) Field of Classification Search .................... 381/56, 381/66, 86, 63, 59, 80–81, 97

See application file for complete search history.

(56) References Cited

U.S. PATENT DOCUMENTS

| | | | | |
|---|---|---|---|---|
| 5,737,431 | A * | 4/1998 | Brandstein et al. | 381/92 |
| 2001/0016047 | A1 | 8/2001 | Ohta | |
| 2003/0121403 | A1 | 7/2003 | Miyagishima et al. | |
| 2004/0240676 | A1 * | 12/2004 | Hashimoto et al. | 381/56 |

FOREIGN PATENT DOCUMENTS

| | | | |
|---|---|---|---|
| JP | 7-064582 | A | 3/1995 |
| JP | 2001-224092 | A | 8/2001 |
| JP | 2003-195859 | A | 7/2003 |
| JP | 2003-255955 | A | 9/2003 |

* cited by examiner

*Primary Examiner* — Xu Mei

*Assistant Examiner* — Douglas Suthers

(74) *Attorney, Agent, or Firm* — Sughrue Mion, PLLC

(57) ABSTRACT

The present invention provides a sound reproducing system capable of accurately analyzing a reverberation characteristic of amplified sound including an arrival direction of a reverberation component, which is more natural, and has higher realistic sensation. A surround system 100 has a speaker system 130, a signal processing apparatus 120 for recognizing a reverberation characteristic of a listening room 10 and adjusting a reverberation component of sound source to be amplified on the basis of the recognized reverberation characteristic, and a microphone array 140 constructed by a plurality of microphones M disposed in the listening room 10 and having the same characteristics, and in which distances among the microphones M are determined in advance. In the case where sound source is amplified and output from the speaker system 130 to the listening room 10, the microphone array 140 collects amplified sound in a specific listening position in the listening room 10.

7 Claims, 11 Drawing Sheets

REVERBERATION ADJUSTING APPARATUS, REVERBERATION CORRECTING METHOD, AND SOUND REPRODUCING SYSTEM

TECHNICAL FIELD

The present invention belongs to a technical field of a reverberation adjusting apparatus and a sound reproducing system capable of correcting reverberation.

BACKGROUND ART

In recent years, at the time of reproducing sound source such as music, a reproducing apparatus such as an AV amplifier that performs correction of a sound field in a sound field space in which the sound source is reproduced is practically used. Recently, attention is being paid to a technique of correcting a reverberation characteristic of sound source on the basis of the characteristics of a sound field space in which sound source is reproduced and performing a reverberation control on the sound field space. In this case, it is important to accurately analyze a reverberation characteristic in a sound field space in which the sound source is reproduced, that is, a reverberation characteristic related to the intensity of sound in a listening position of amplified sound. In particular, as a technique for analyzing such a reverberation characteristic, a method of analyzing a reverberation characteristic of a sound field space by collecting a test signal amplified in the sound field space into the sound field space is known.

Hitherto, a sound reproducing system for conducting such an analysis of a sound field space has a plurality of speakers disposed in the sound field space and a microphone disposed in a listening position in the sound field space and, when a predetermined test signal is amplified, for collecting amplified sound of the test signal. On the basis of the test signal collected by the microphone, a characteristic of the amplified sound in the listening position is analyzed. On the basis of the analysis result, a signal process of sound source to be reproduced is performed (for example, Japanese Patent Application Laid-Open (JP-A) No. 2003-255955).

DISCLOSURE OF INVENTION

Problems to be Solved by the Invention

However, in the conventional sound reproducing system, test signals amplified and output from a plurality of speakers or a selected speaker are collected by a single microphone. Consequently, a reverberation characteristic having a direction characteristic indicative of an arrival direction of a reverberation component in amplified sound in a listening position, which is in the listening position of the amplified sound, cannot be estimated. The reverberation characteristic of the sound field space cannot be accurately analyzed, that is, the reverberation characteristic of the sound field space cannot be accurately grasped. As a result, in the sound reproducing system, even if the signal process of sound source to be reproduced is performed on the basis of the analysis result, there is a case that the listener feels strange or sound source is reproduced without realistic sensation when the sound source is reproduced in the sound field space.

The present invention has been achieved in consideration of the problems. An object of the invention is to provide a sound reproducing system and a reverberation adjusting apparatus capable of accurately analyzing a reverberation characteristic in a listening position of amplified sound, which has a direction characteristic of a reverberation component of the amplified sound in the listening position, and reproducing sound more naturally and with higher realistic sensation on the basis of the analyzed reverberation characteristic.

Means for Solving the Problems

To solve that problem, a first aspect of the invention provides a sound reproducing system comprising: a speaker system constructed by a plurality of speakers disposed in a sound field space; a reverberation adjusting apparatus for recognizing a reverberation characteristic in the sound field space by amplifying sound source by the speaker system and, on the basis of the recognized reverberation characteristic, adjusting a reverberation component in the sound source which is output from the speaker system; and a microphone array which is constructed by a plurality of microphones disposed in the sound field space and having the same characteristics, in which distances among the microphones are preliminarily determined and, when the sound source is amplified and the amplified sound is output from the speaker system to the sound field space, for collecting the amplified sound in a specific listening position in the sound field space, wherein the reverberation adjusting apparatus comprises: a first obtaining device for obtaining a sound signal as the sound source; a generating device for generating, as the sound source, a test signal used for analyzing a reverberation characteristic of the sound field space; an output control device for amplifying at least one of the sound signal and the test signal and outputting the amplified signal from the speaker system; a second obtaining device for obtaining, as an amplified sound signal, an amplified sound collected by the microphone array; a recognizing device for recognizing a reverberation characteristic having a direction characteristic indicative of an arrival direction of a reverberation component of amplified sound in the listening position on the basis of the obtained amplified sound signal, and indicative of attenuation with time in the sound field space on intensity of sound in the listening position of the amplified sound; and an adjusting device for adjusting the reverberation characteristic of the sound source to be amplified and output from the obtained speaker on the basis of the recognized reverberation characteristic.

According to a seventh aspect of the invention, there is provided a reverberation adjusting method for adjusting a reverberation component in sound source output from a speaker system constructed by a plurality of speakers on the basis of a reverberation characteristic of a sound field space to which amplified sound is output from the speaker system, comprising: a test signal amplifying process for generating a test signal used for analyzing the reverberation characteristic in the sound field space as the sound source, and amplifying the generated test signal by the speaker system; a sound collecting process for collecting, as an amplified sound signal, the test signal output from the speaker system to the sound field space by a microphone array which is constructed by a plurality of microphones disposed in the sound field space and having the same characteristics; a recognizing process for recognizing a reverberation characteristic having a direction characteristic indicative of an arrival direction of a reverberation component of amplified sound in the listening position on the basis of the obtained amplified sound signal, and indicative of attenuation with time in the sound field space on intensity of sound in the listening position of the amplified sound; and an adjusting process, at the time of obtaining and amplifying sound source to be amplified by the speaker system, for adjusting the reverberation characteristic of the obtained sound signal on the basis of the recognized reverberation characteristic.

According to an eighth aspect of the invention, there is provided a reverberation adjusting apparatus for adjusting a reverberation component in sound source output from a speaker system constructed by a plurality of speakers on the basis of a reverberation characteristic of a sound field space to which amplified sound is output from the speaker system, comprising: a first obtaining device for obtaining a sound signal as the sound source in the case of collecting the sound amplified and output to the sound field space by the speaker system in a specific listening position by a microphone array constructed by a plurality of microphones disposed in the sound field space and having the same characteristics; a generating device for generating, as the sound source, a test signal used for analyzing a reverberation characteristic of the source field space; an output control device for amplifying one of the sound signal and the test signal and outputting the amplified signal from the speaker system; a second obtaining device for obtaining an amplified sound signal collected by the microphone array; a recognizing device for recognizing a reverberation characteristic having a direction characteristic indicative of an arrival direction of a reverberation component of amplified sound in the listening position on the basis of the obtained amplified sound signal, and indicative of attenuation with time in the sound field space on intensity of sound in the listening position of the amplified sound; and an adjusting device for adjusting the reverberation characteristic of the obtained sound source to be output to the speaker system on the basis of the recognized reverberation characteristic.

According to a ninth aspect of the invention, there is provided a sound reproducing system comprising: a speaker system constructed by a plurality of speakers disposed in a sound field space; a reverberation adjusting apparatus for recognizing a reverberation characteristic in the sound field space by amplifying sound source by the speaker system and, on the basis of the recognized reverberation characteristic, adjusting a reverberation component in the sound source which is output from the speaker system; and a microphone disposed in the sound field space, having a direction characteristic in a predetermined direction, when the sound source is amplified and the amplified sound is output from the speaker system to the sound field space, for collecting the amplified sound in a specific listening position in the sound field space, wherein the reverberation adjusting apparatus comprises: a first obtaining device for obtaining a sound signal as the sound source; a generating device for generating, as the sound source, a test signal used for analyzing a reverberation characteristic of the sound field space; an output control device for amplifying at least one of the sound signal and the test signal and outputting the amplified signal from the speaker system; a second obtaining device for obtaining, as an amplified sound signal, an amplified sound collected by the microphone array; a recognizing device for recognizing a reverberation characteristic having a direction characteristic indicative of an arrival direction of a reverberation component of amplified sound in the listening position on the basis of the obtained amplified sound signal, and indicative of attenuation with time in the sound field space on intensity of sound in the listening position of the amplified sound; and an adjusting device for adjusting the reverberation characteristic of the sound source to be amplified and output from the obtained speaker on the basis of the recognized reverberation characteristic.

DESCRIPTION OF REFERENCE NUMERALS

Figure 1:
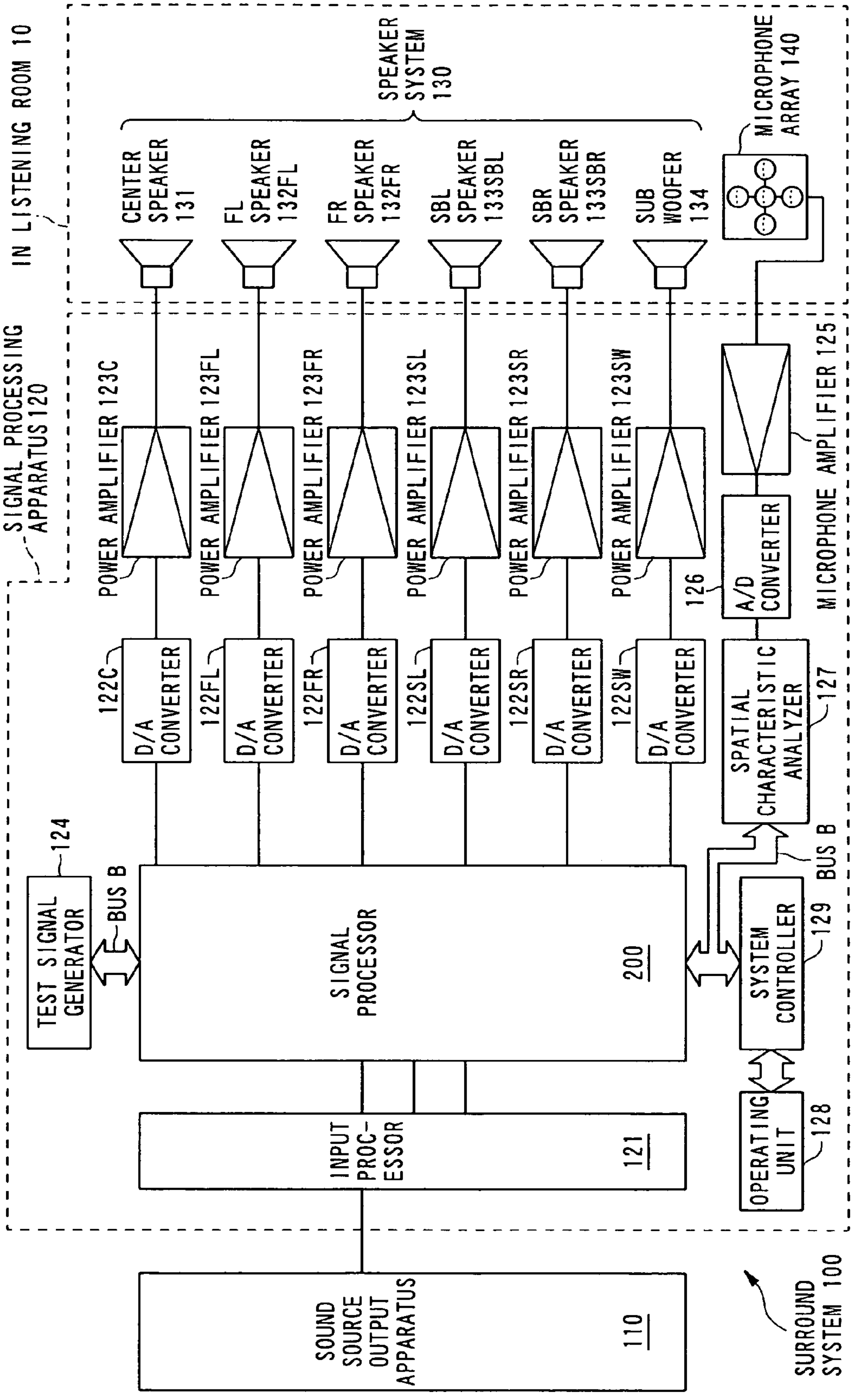
FIG. 1 is a block diagram showing the configuration of a surround system of an embodiment of the invention.

100 Surround system
120 Signal processing apparatus
130 Speaker system
140 Microphone array
127 Spatial characteristic analyzer
127C Reverberant characteristic analyzer
129 System controller
200 Signal processor
250 Reverberation control circuit
251 Signal dividing unit
252 Signal component generating unit
253 Signal component combining unit

BEST MODE FOR CARRYING OUT THE INVENTION

Preferred embodiments of the invention will now be described based on the drawings.

The embodiments described below relate to the case of applying a reverberation adjusting apparatus or a sound field reproducing system of the invention to a 5.1ch surround system (hereinafter, simply referred to as surround system).

First, the configuration of the surround system of the embodiment will be described with reference to FIG. 1. FIG. 1 is a block diagram showing the configuration of the surround system of the embodiment. FIGS. 2 to 7 are diagrams showing examples of the configuration of a microphone array of the embodiment.

As shown in FIG. 1, a surround system 100 of the embodiment is disposed in a listening room 10, that is, a sound field space for providing the listener with reproduction sound. The surround system 100 reproduces or obtains a sound source and performs a predetermined signal process on the reproduced sound or obtained sound. The surround system 100 amplifies the signal-processed sound on the speaker unit basis by a 5.1ch speaker system 130, thereby providing the listener with a sound field space with the presence of a live performance (with surrounding sound).

The surround system 100 is constructed by: a sound source output apparatus 110 for outputting bit stream data of a predetermined format having a channel component corresponding to each speaker by reproducing a sound source such as a recording medium or obtaining a sound source from the outside such as a television signal; a signal processing apparatus 120 for decoding the bit stream output from the sound source output apparatus 110 to an audio signal for each channel, performing a signal process on the audio signal of each channel, and analyzing a reverberation characteristic and the other spatial characteristics of the listening room 10; the speaker system 130 consisted of various speakers corresponding to various channels; and a microphone array 140 used at the time of analyzing the spatial characteristics of the listening room 10.

The channels denote transmission paths of the audio signals output to the speakers, and each channel transmits an audio signal basically different from audio signals of the other channels.

For example, the signal processing apparatus 120 of the embodiment corresponds to a reverberation adjusting apparatus of the present invention, the speaker system 130 corresponds to a speaker system 130 of the invention, and the microphone array 140 corresponds to the microphone array 140 of the invention.

The sound source output apparatus 110 is constructed by, for example, an apparatus for reproducing media such as CD (Compact Disc) or DVD (Digital Versatile Disc) or a receiving apparatus for receiving a digital television broadcasting. The sound source output apparatus 110 reproduces a sound source such as CD or obtains a broadcasted sound source and outputs bit stream data having a channel component corresponding to 5.1ch to the signal processing apparatus 120.

To the signal processing apparatus 120, the bit stream data having channel components output from the sound source output apparatus 110 is input. The signal processing apparatus 120 decodes the input bit stream data to audio signals of the respective channels.

The signal processing apparatus 120 performs:

(1) adjustment of the frequency characteristic of each of the decoded audio signals;

(2) addition of a preset reverberation component to each of the decoded audio signals;

(3) adjustment of the signal level and a delay amount in each of the decoded audio signals; and (4) analysis of the spatial characteristics such as the frequency characteristic and the reverberation characteristic in a listening position in the listening room 10, and conversion of the audio signals subjected to the signal process to analog signals, thereby adjusting the sound volume level. The signal processing apparatus 120 outputs the audio signals whose sound volume level has been adjusted to the speakers of the speaker system 130.

The details of the configuration and operation of the signal processing apparatus 120 in the embodiment will be described later.

The speaker system 130 has: a center speaker 131 disposed in front of a listener; a front right speaker (hereinafter, referred to as FR speaker) 132FR and a front left speaker (hereinafter, referred to as FL speaker) 132FL disposed in front of the listener and on the right or left side of the center speaker 131; a right surround speaker (hereinafter, referred to as SR speaker) 133SR and a left surround speaker (hereinafter, referred to as SL speaker) 133SL disposed on the rear side of the listener and on the right or left sides, respectively, of the FR speaker 132FR and the FL speaker 132FL; and a low-frequency reproduction speaker (hereinafter, referred to as sub woofer) 134 disposed in an arbitrary position.

Specifically, the center speaker 131, the FL speaker 132FL, the FR speaker 132FR, the SL speaker 133SL, and the SR speaker 133SR are full-range speakers having the reproducible frequency characteristic in almost the full range of the frequency band used at the time of amplifying an audio signal. Each of the speakers amplifies the audio signals with its radial axis directed to the listening position. The sub woofer 134 is used at the time of amplifying signals in a predetermined low frequency band.

The microphone array 140 is constructed by a plurality of microphones M disposed in the listening room 10 and having the same characteristic. When an audio signal is amplified and output from the speaker system 130 to the listening room 10, the microphone array 140 collects the amplified sound in a specific listening position in the listening room 10. In particular, in the microphone array 140 of the embodiment, the amplified sound based on the test signal output from the speaker system 130 is collected on the microphone M unit basis. The microphone array 140 converts the collected amplified sound to an electric signal, and outputs the electric signal as a collected sound signal (hereinafter, also referred to as amplified sound signal) to the signal processing apparatus 120.

Specifically, the microphone array 140 has a configuration in which the plurality of microphones M are arranged on a plane parallel with the floor surface of the listening room 10.

Figure 2:
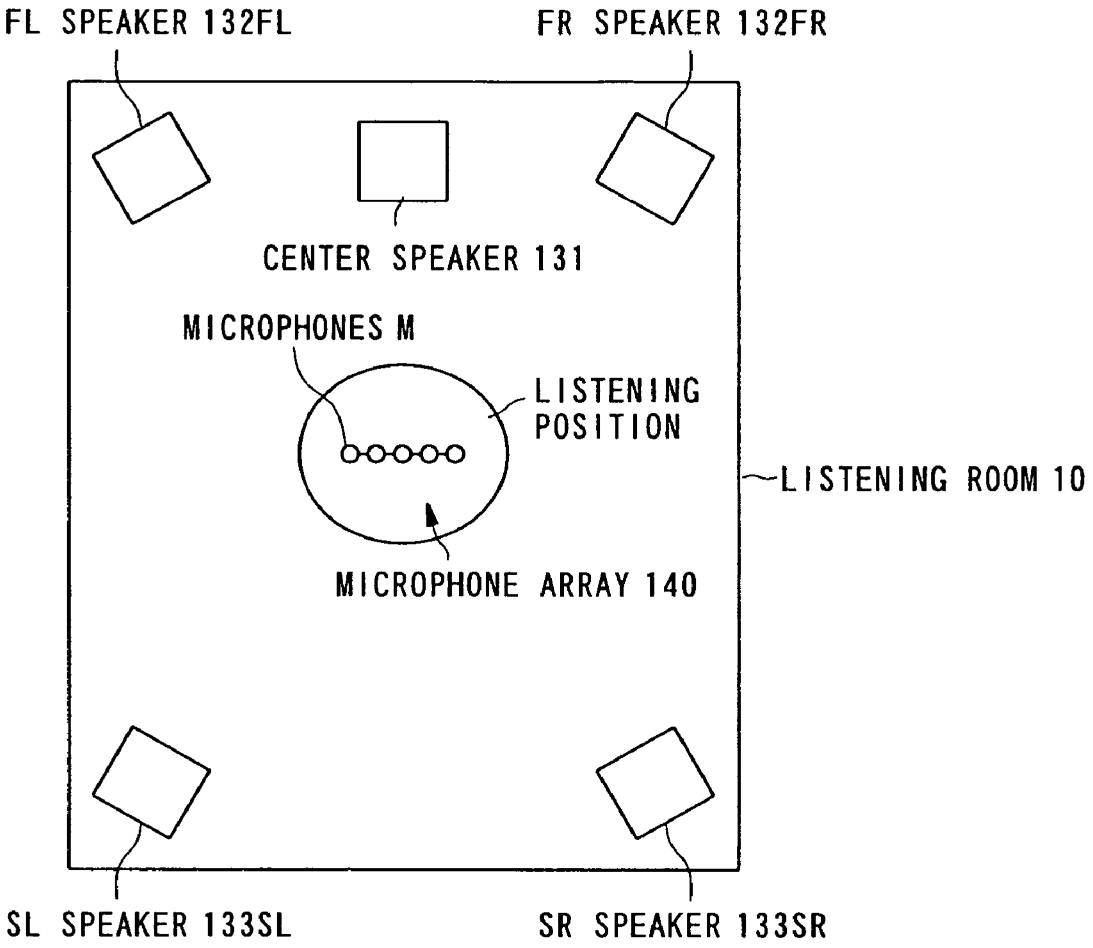
FIG. 2 is a diagram showing an example of the configuration of a microphone array in the embodiment, which is a linear array.
Figure 3:
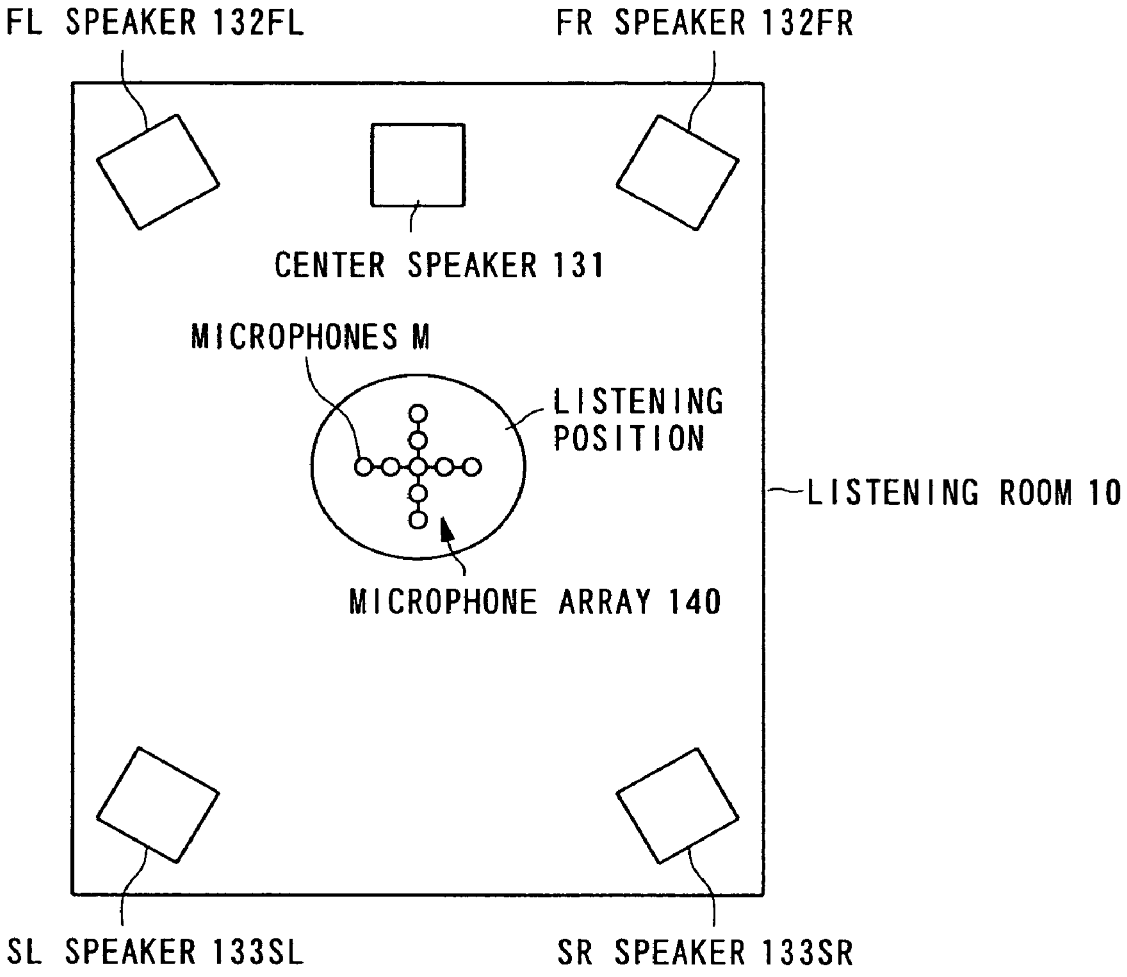
FIG. 3 is a diagram showing an example of the configuration of a microphone array in the embodiment, which is a cross array.
Figure 4:
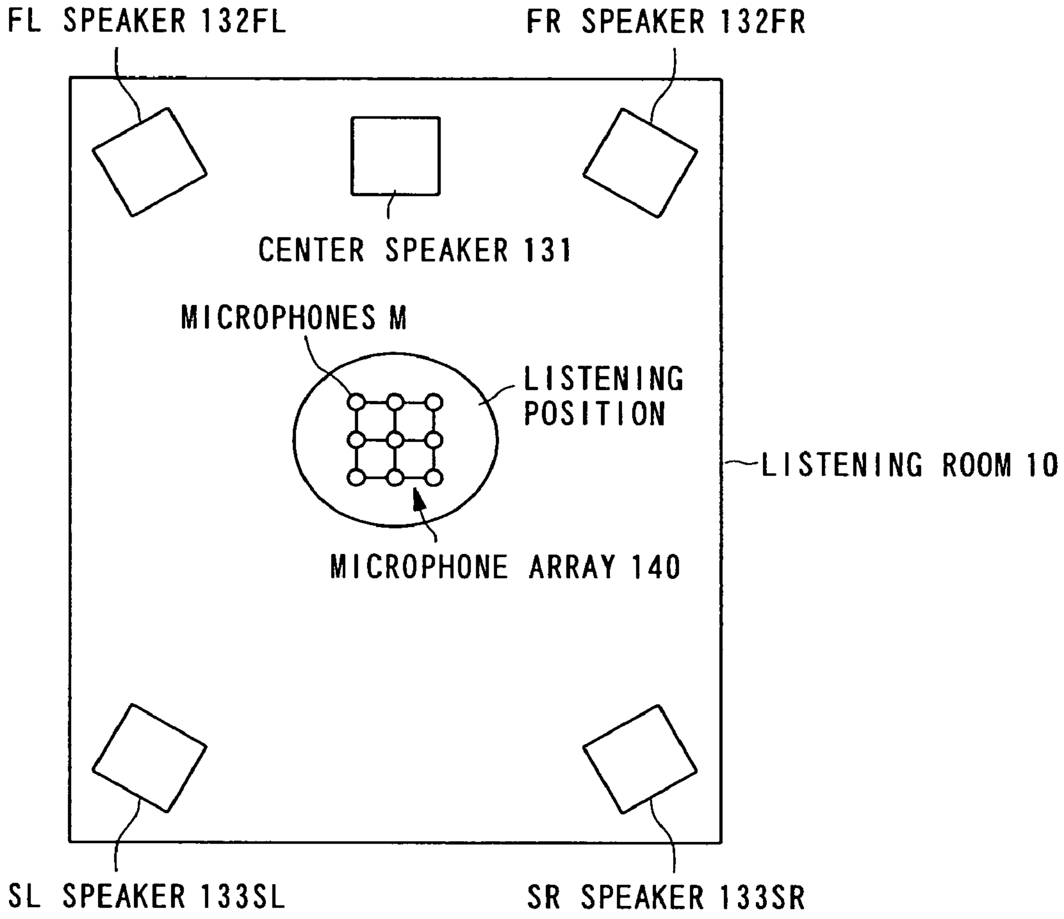
FIG. 4 is a diagram showing an example of the configuration of a microphone array in the embodiment, which is a square array.

For example, the microphone array 140 is a linear array, a cross array, or a square array. In the linear array, as shown in FIG. 2, the microphones M are arranged on an axis orthogonal to the direction of amplifying sound (hereinafter, simply referred to as sound amplification direction) which is recognized when sound is amplified by the speaker system 130. As shown in FIG. 3, the cross array is constructed by a first array in which a plurality of microphones M are arranged in the same axial direction as the sound amplification direction and a second array in which a plurality of microphones M are arranged in parallel on an axis orthogonal to the first array. In the square array, as shown in FIG. 4, a plurality of microphones M are arranged on the plane parallel with the floor surface using the center of the listening position as a reference.

Figure 5:
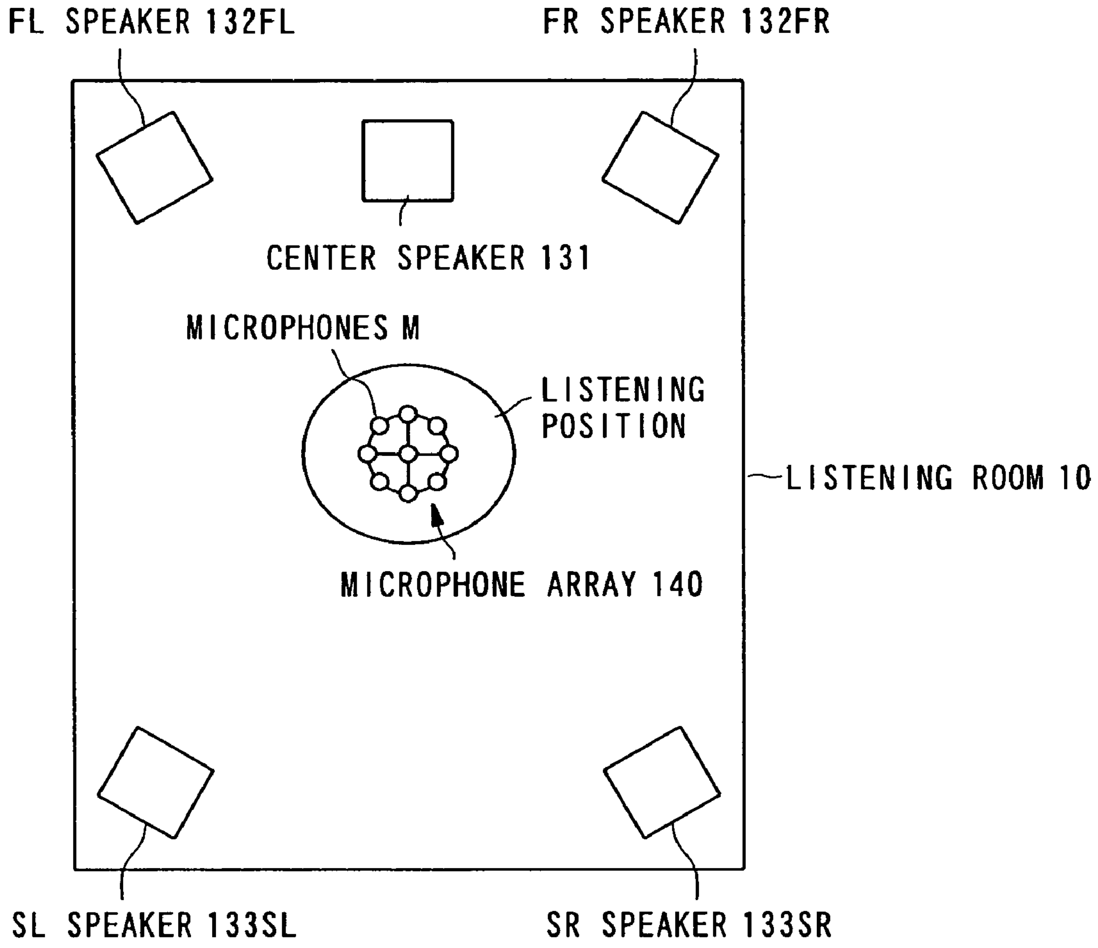
FIG. 5 is a diagram showing an example of the configuration of a microphone array in the embodiment, which is a circular array.
Figure 6:
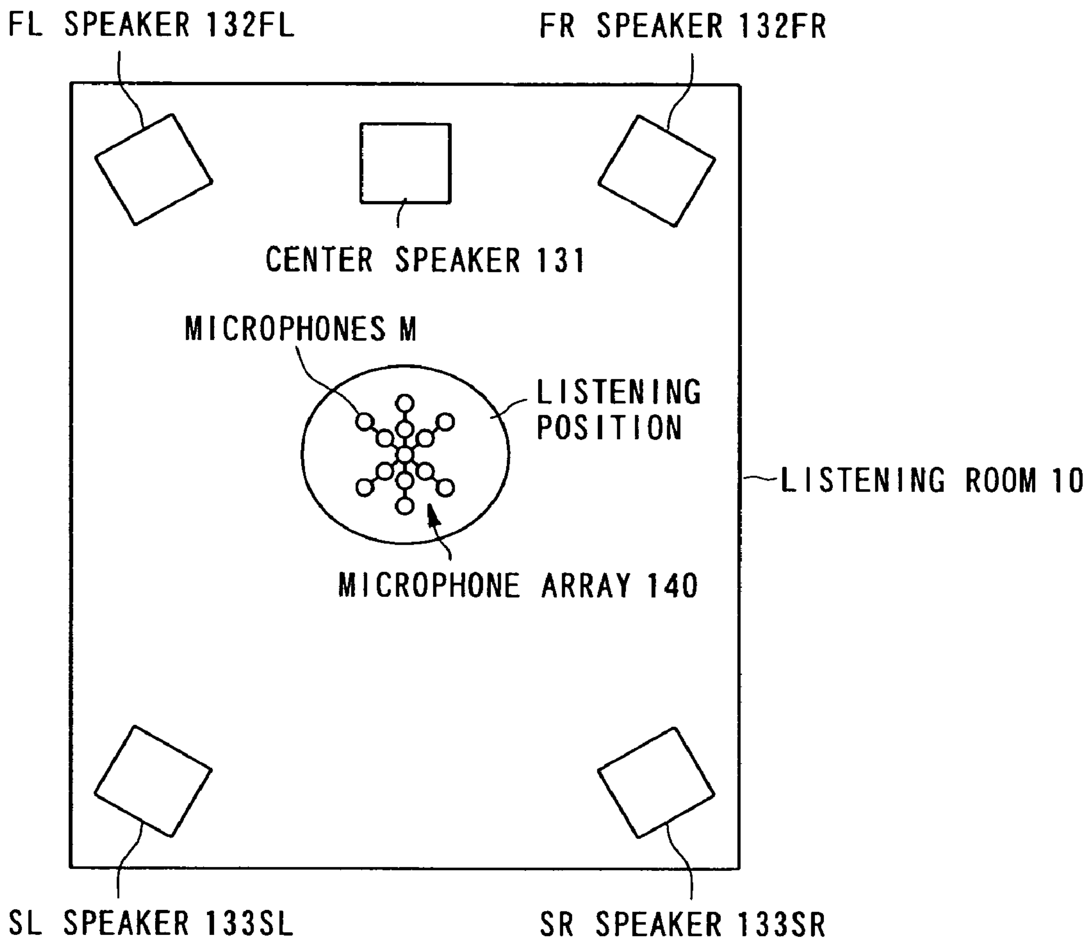
FIG. 6 is a diagram showing an example of the configuration of a microphone array in the embodiment, which is a radial array (I)
Figure 7:
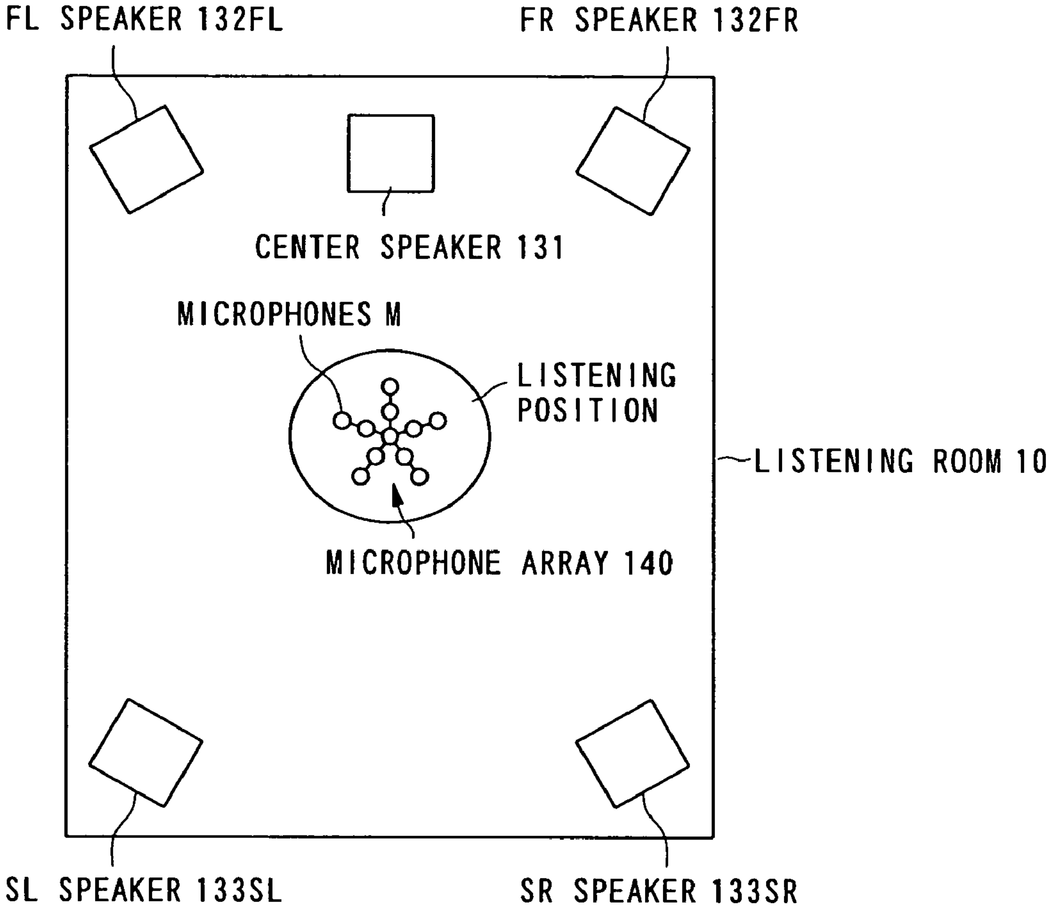
FIG. 7 is a diagram showing an example of the configuration of a microphone array in the embodiment, which is a radial array (II)

The microphone array 140 is a circular array or a radial array. In the circular array, as shown in FIG. 5, a plurality of microphones M are arranged so as to form a circular shape on the plane parallel with the floor surface using the center of the listening position as a reference. In the radial array, as shown in FIGS. 6 and 7, a plurality of microphones M are arranged in parallel in six or five directions at equal intervals by using the sound amplification direction as a reference on the surface parallel with the floor surface.

In the microphone array 140, the result of detection of the directivity in amplified sound in the listening room 10 which will be described later varies according to the number of the microphones M and the array shape. Generally, the larger the number of the microphones M is, the more the directivity of the amplified sound can be detected strictly. To detect the directivity of amplified sound from all of the directions to the listening position, it is desirable to arrange a plurality of microphones M using the center of the listening position as a reference.

The configuration and operation of the signal processing apparatus 120 in the embodiment will now be described.

The signal processing apparatus 120 of the embodiment has, as shown in FIG. 1, an input processor 121 to which bit stream data in a predetermined format having channel components is input, and which converts the bit stream data to audio data in a signal format used at the time of decoding to an audio signal of each channel, a signal processor 200 for performing a signal process such as decoding of the converted audio data to an audio signal of each channel and adjustment of the reproduction characteristic including a reverberation characteristic on amplified sound on the channel unit basis, a D/A converter 122 for digital-to-analog (hereinafter, referred to as D/A) converting an audio signal of each channel to an analog signal, and a power amplifier 123 for amplifying the reproduction level of the signal of each channel on the channel unit basis.

The signal processing apparatus 120 also has a test signal generator 124 for generating a test signal used at the time of analyzing spatial characteristics of the listening room 10, particularly, a reverberation characteristic in the embodiment, a microphone amplifier 125 for amplifying a signal collected by the microphone array 140 to a preset signal level, an A/D converter 126 for performing analog-to-digital (A/D) conversion that converts the amplified sound signal as an analog signal to a digital signal, a spatial characteristic analyzer 127 for analyzing the spatial characteristics of the listening room 10 on the basis of the sound-collected signal converted to the digital signal, an operating unit 128 for operating each of the components; and a system controller 129 for controlling each of the components on the basis of the operation of the operating unit 128.

For example, the input processor 121 of the embodiment corresponds to a first obtaining device of the invention, and the signal processor 200 corresponds to an adjusting device. For example, the power amplifier 123 of the embodiment corresponds to an output control device of the invention, and the test signal generator 124 corresponds to a generating device of the invention. Further, for example, the spatial characteristic analyzer 127 of the embodiment corresponds to a second obtaining device and a recognizing device of the invention.

To the input processing unit 121, the bit stream data in a predetermined format having channel components is input. The input processing unit 121 converts the input bit stream data to audio data in a predetermined format, and outputs the converted audio data to the signal processor 200.

To the signal processor 200, the audio data output from the input processing unit 121 and the test signal generated by the test signal generator 124 is input. The signal processor 200 decodes the input audio data to audio signals of respective channels, performs a predetermined signal process on the channel unit basis to adjust the reproduction characteristic, and outputs the audio signal of each channel to the corresponding D/A converter 122. The signal processor 200 performs a predetermined process for amplifying an input test signal to each of the speakers under control of the system controller 129, and outputs the test signal as an audio signal to each of the D/A converter 122 on the channel unit basis.

Specifically, as described later, the signal processor 200 determines a coefficient necessary at the time of respective performing signal processes such as frequency characteristic adjustment, delay time control, signal level control, and reverberation control on an input signal on the basis of the data of parameters output from the spatial characteristic analyzer 127, performs a signal process on the basis of respective determined coefficients, and outputs the resultant to respective D/A converters 122.

The details of the configuration and operation of the signal processor 200 in the embodiment will be described later.

To the D/A converters 122, each of the audio signals subjected to each of the signal processes are input on the channel unit basis. The D/A converters 122 convert each of the audio signals and test signals as the input digital signals to analog signals and output the analog signals to the respective power amplifiers 123.

To the power amplifiers 123, the processed audio signals are input on the channel unit basis. Under control of the system controller 129, each of the power amplifiers 123 amplifies the signal level of the audio signal of a corresponding channel on the basis of an instruction of volume designated by the operating unit 128, and outputs the amplified audio signal to each of the speakers corresponding to each of the channels.

The test signal generator 124 generates a test signal used at the time of analyzing the spatial characteristics such as the frequency characteristic of the listening room 10, the level characteristic of a reproduction level, the delay time analysis, and a reverberation characteristic, and outputs the generated test signal to the signal processor 200. Specifically, the test signal generator 124 generates a test signal such as sweep signal for sweeping, for example, white noise, pink noise, or frequencies in a predetermined frequency range under control of the system controller 129, and outputs the generated test signal to the signal processor 200.

The test signal generator 124 of the embodiment generates a test signal interlockingly with the signal processor 200 and the spatial characteristic analyzer 127 under control of the system controller 129, and used at the time of executing processes of adding and generating a reverberation component which will be described later.

To the microphone amplifier 125, the collected sound signal which is output from each of the microphones M in the microphone array 140 is input. The microphone amplifier 125 amplifies the input collected sound signal to a preset signal level and outputs the amplified collected sound signal to the A/D converter 126.

The collected sound signal which is output from each of the microphones M output from the microphone amplifier 125 is input to the A/D converter 126. The A/D converter 126 converts the input collected sound signal as an analog signal to a digital signal, and outputs the collected sound signal converted to the digital signal to the spatial characteristic analyzer 127.

To the spatial characteristic analyzer 127, the collected sound signal converted to the digital signal is input. On the basis of the input collected sound signal, the spatial characteristic analyzer 127 analyzes the frequency characteristic of the output amplified sound on the channel unit basis, the reproduction level of the sound, delay time, and the reverberation characteristic of the sound. The spatial characteristic analyzer 127 calculates a predetermined parameter for determining a coefficient necessary at the time of performing signal processes in the signal processor 200 on the basis of analysis results, and outputs the calculated parameter data to the signal processor 200. In particular, the spatial characteristic analyzer 127 of the embodiment performs the analyses on the basis of the sound-collected signal based on the test signal output from the speaker system 130 and calculates each parameter.

The details of the configuration and operation of the spatial characteristic analyzer 127 in the embodiment will be described later.

The operating unit 128 is constructed by a remote controller including a number of keys such as various confirmation buttons, selection buttons, and numeral keys, or various key buttons. The operating unit 128 is used to enter an instruction for analysis of the spatial characteristic in the listening room 10. In particular, in the embodiment, the operating unit 128 is used to perform operation related to processes of generating and adding a reverberation component to an audio signal to be amplified.

The system controller 129 controls, in a centralized manner, the general functions for amplifying the audio signals from the speakers. In particular, the system controller 129 makes a predetermined process on a sound signal collected by each of the microphones M, and has a directional characteristic indicative of the arrival direction of a reverberation component in the amplified sound at the listening position. The system controller 129 performs a control of an analysis process of analyzing the reverberation characteristic indicative of attenuation with time in the sound field space, of strength of the amplified sound in the listening position (hereinafter, referred to as reverberation characteristic analyzing process). The system controller 129 also performs a control of a process of calculating a coefficient necessary at the time of performing a reverberation control (hereinafter, referred to as reverberation control coefficient) in the signal processor 200 on the basis of the analyzed reverberation characteristic of the listening room 10 and a process of setting the coefficient (hereinafter, the calculating process and the setting process will be referred to as a reverberation control coefficient setting process).

The reverberation characteristic denotes a characteristic showing attenuation with time of the amplitude level (strength) of an amplified sound which is listened in an arbitrary listening position in the listening room 10. Specifically, the reverberation characteristic denotes a characteristic of an amplitude level attenuation ratio using, as reference, first arrived amplified sound (direct sound) in the listening position from an arbitrary speaker and the time in each of frequency bands on the basis of the sound-collected signal in an input test signal.

The details of the operations of the reverberation characteristic analyzing process and the reverberation control coefficient setting process of the system controller 129 in the embodiment will be described later.

Figure 8:
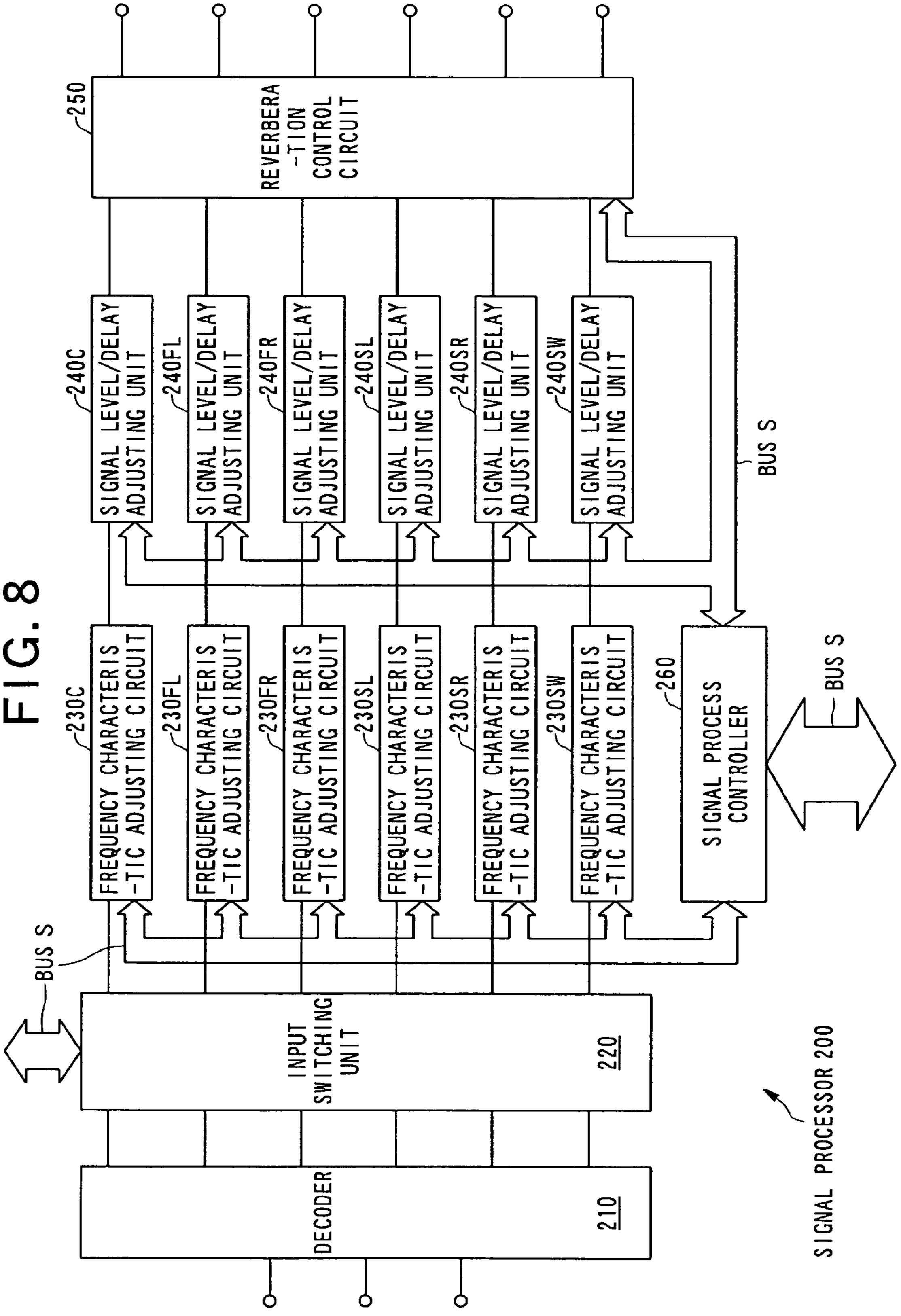
FIG. 8 is a block diagram showing the configuration of a signal processor in the embodiment.

Referring now to FIG. 8, the configuration and operation of the signal processor 200 of the embodiment will now be described. FIG. 8 is a block diagram showing the configuration of the signal processor 200 in the embodiment.

As described above, the signal processor 200 decodes input audio data to an audio signal of each channel, and switches entry between the decoded audio signal of each channel and a test signal output from the test signal generator 124. The signal processor 200 performs a predetermined signal process on the channel unit basis on an input signal, thereby adjusting the reproduction characteristic, and performs a predetermined process for amplifying an input test signal on the speaker unit basis under control of the system controller 129.

Specifically, the signal processor 200 has: a decoder 210 for decoding input audio data to audio signals in channels; an input switching unit 220 for switching between the audio signals in each of the channels obtained from the data and an input test signal; a frequency characteristic adjusting circuit 230 for adjusting the frequency characteristics of the audio signals in each of the channels or the test signal; a signal level/delay adjusting unit 240 for adjusting the signal level between the channel of a signal and the other channels and delaying a signal input on the channel unit basis; a reverberation control circuit 250 for generating a reverberation component of an audio signal of each channel or the test signal on the basis of a reverberation control coefficient which is set as will be described later and adding the reverberation component to the audio signal or the test signal; and a signal process controller 260 for controlling each of the components of the signal processor 200 under control of the system controller 129.

The signal processor 200 has the frequency characteristic adjusting circuit 230, the signal level/delay adjusting unit 240, and the reverberation control circuit 250 for each of the channels, and the signal process controller 260 and the other components are connected to each other via a bus B.

Audio data is input to the decoder 210. The decoder 210 decodes the input audio data to audio signals of respective channels, and outputs the audio signals to the input switching unit 220 on the channel unit basis.

To the input switching unit 220, the audio signals decoded on the channel unit basis and a test signal output from the test signal generator 124 are input. The input switching unit 220 switches between the audio signal output from the decoder 210 and the test signal generated by the test signal generator 124 under control of the signal process controller 260, and outputs the switched signal to the frequency characteristic adjusting circuits 230. At the time of outputting a test signal, the input switching unit 220 outputs the test signal to the channels or one of the channels selected by the signal process controller 260.

In each of the frequency characteristic adjusting circuits 230, a filter factor for adjusting the gain of a signal component is set on the frequency band unit basis under control of the signal process controller 260. To each of the frequency characteristic adjusting circuit 230, an input audio signal of each channel or a test signal is input. The frequency characteristic adjusting circuit 230 adjusts the frequency characteristic on the input signal on the basis of the set filter factor, and outputs the adjusted frequency characteristic to the corresponding signal level/delay adjusting unit 240.

In each of the signal level/delay adjusting units 240, under control of the signal process controller 260, a coefficient for adjusting the attenuation ratio in each of the channels (hereinafter, referred to as an attenuation coefficient) in each channel and a coefficient for adjusting a delay amount (delay time) in the audio signal corresponding to the channel or the test signal (hereinafter, referred to as delay control coefficient) are set. To each of the signal level/delay adjusting units 240, the audio signal whose frequency characteristic is adjusted in each of the frequency bands or the test signal is input. Each of the signal level/delay adjusting units 240 adjusts the attenuation ratio and the delay amount of each of the channels in the input signal on the basis of the set attenuation coefficient and the delay control coefficient, and outputs the audio signal or test signal in which the attenuation ratio and the delay amount are adjusted to the corresponding reverberation control circuit 250.

In each of the reverberation control circuit 250, a reverberation control coefficient determined by the signal process controller 260 as will be described later is set. The reverberation control circuits 250 executes a reverberation control on the audio signal or test signal subjected to the signal level adjustment, and outputs the resultant signal to each of the D/A converters 122.

Specifically, to the reverberation control circuits 250, the audio signal or test signal whose signal level and delay amount are adjusted are input. The reverberation control circuits 250 divides the audio signals or test signals input on the channel unit basis to a plurality of frequency bands. Each of the reverberation control circuits 250 performs the reverberation control by generating the reverberation components in each of the frequency bands in the input audio signal or test signal input on the basis of the reverberation control coefficient which will be described later, and adding the generated reverberation component to the input audio signal or test signal, and outputs the signal subjected to the reverberation control to each of the D/A converters 122.

At the time of performing a reverberation control by generating a reverberant component for an input signal and adding it, the reverberation control circuit 250 performs the reverberation control including the direction characteristic of the reverberation component, thereby adjusting a reverberation component to be generated among the channels. That is, the reverberation control circuit 250 of the embodiment performs the reverberation control on the speaker unit basis (hereinafter, also referred to as a speaker system) on an input signal of each channel so that the reverberation component has the direction characteristic when the reverberation component is amplified.

The details of the configuration and operation of the reverberation control circuit 250 in the embodiment will be described later. For example, the reverberation control circuit 250 of the embodiment corresponds to an adjusting device of the invention.

In response to an instruction of the system controller 129, the signal process controller 260 determines and sets coefficients of each of the frequency characteristic adjusting circuits 230, each of the signal level/delay adjusting units 240, and each of the reverberation control circuits 250.

Specifically, the signal process controller 260 calculates the filter factor, attenuation coefficient, and delay control coefficient on the basis of the data of the parameters analyzed by the spatial characteristic analyzer 127 and sets them in the components. In addition, the signal process controller 260 calculates a reverberation control coefficient for performing a control of generating a reverberation component in the reverberation control circuit 250 on the basis of the reverberation parameters, and sets the calculated reverberation control coefficient in the reverberation control circuit 250.

In particular, the signal process controller 260 in the embodiment has a table for calculating reverberation control coefficients in the reverberation control circuit 250 on the basis of the input reverberation parameters. When the reverberation parameter is input, the signal process controller 260 calculates a predetermined reverberation control coefficient on the basis of the table.

For example, to the signal process controller 260, as will be described later, a reverberation parameter for calculating a coefficient used at the time of controlling a reverberation component having the direction characteristic is input. On the basis of the reverberation parameter indicative of the characteristic of the reverberation component analyzed as will be described later, the signal process controller 260 adds the level of the reverberation component and delay time to the audio signal of each channel or the test signal, and calculates the reverberation control coefficient for adjustment among channels of the reverberation component to be added so that the added reverberation component can be listened from the analyzed arrival direction. The signal process controller 260 sets the calculated reverberation control coefficient in the reverberation control circuit 250.

In the embodiment, the signal process controller 260 calculates a reverberation control coefficient in each channel, in each of the preset frequency bands, and in each of the speaker systems as will be described later.

Figure 9:
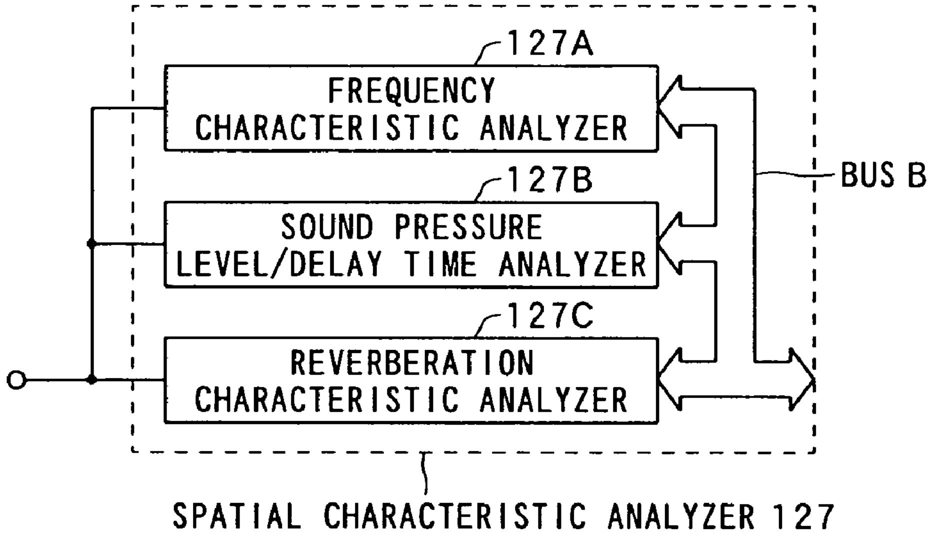
FIG. 9 is a block diagram showing the configuration of a spatial characteristic analyzer in the embodiment.
Figure 10:
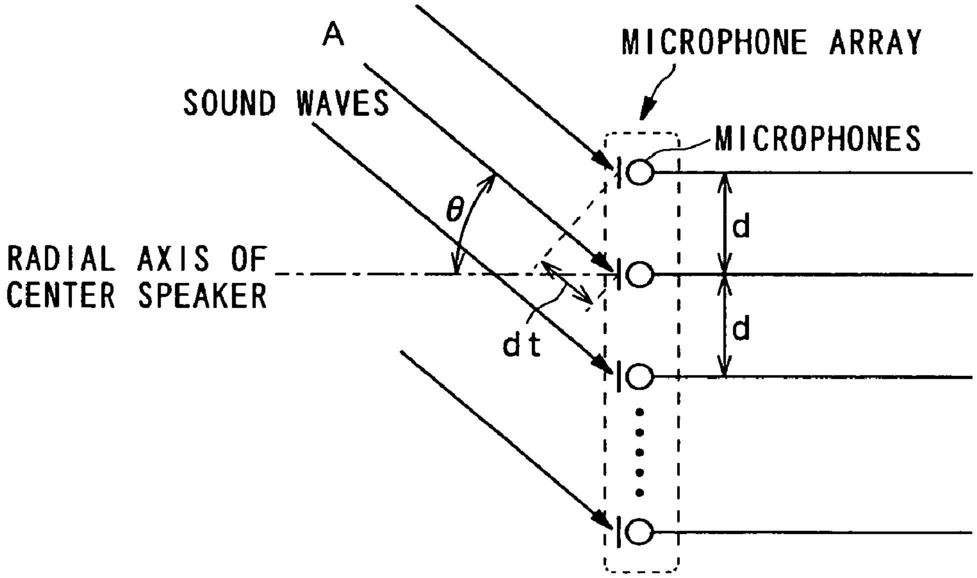
FIG. 10 is a diagram illustrating reverberation component arrival direction estimation in a reverberation characteristic analyzer in the embodiment.

The configuration and operation of the spatial characteristic analyzer 127 in the embodiment will be described with reference to FIGS. 9 and 10. FIG. 9 is a block diagram showing the configuration of the spatial characteristic analyzer 127 in the embodiment. FIG. 10 is a diagram for explaining the reverberation characteristic analysis in the embodiment.

To the spatial characteristic analyzer 127, a sound-collected signal generated by collecting a sound amplified on the basis of a test signal is input. As described above, on the basis of the input sound-collected signal, the spatial characteristic analyzer 127 performs analysis of the frequency characteristic of the amplified sound output on the channel unit basis, analysis of the sound pressure level of the amplified sound, delay time analysis, and analysis of the reverberation component of the amplified sound. On the basis of results of the analysis, the spatial characteristic analyzer 127 outputs data to the signal processor 200 via the system controller 129.

The spatial characteristic analyzer 127 includes: a frequency characteristic analyzer 127A for analyzing the frequency characteristic of the listening room 10; a sound pressure level/delay time analyzer 127B for analyzing the sound pressure level and delay time of amplified sound from each of the speakers in the listening room 10; and the reverberation characteristic analyzer 127C for analyzing the reverberation characteristic of the listening room 10 and calculating the reverberation parameter when the reverberation control coefficient setting process is executed.

The frequency characteristic analyzer 127A analyzes the frequency characteristic in the install position (listening position) of the microphone array 140 in the listening room 10 on the basis of the sound-collected signal in an input test signal, and outputs the result of analysis as data of a predetermined parameter to the signal process controller 260 via the system controller 129. The sound pressure level/delay time analyzer 127B analyzes the sound pressure level and the delay time of amplified sound from each of the speakers in the install position of the microphone array 140 in the listening room 10 on the basis of the collected-sound signal in an input test signal. The sound pressure level/delay time analyzer 127B outputs the analysis result as data of the predetermined parameter to the signal process controller 260 via the system controller 129.

The reverberation characteristic analyzer 127C analyzes the reverberation characteristic including the direction characteristic of the reverberation component of the amplified sound at the listening position in the listening room 10 on the basis of change with time of the reverberation component of a collected test signal at the time of analyzing the reverberation characteristic of the listening room 10, and outputs the analysis result as data of a predetermined reverberation parameter to the signal process controller 260 via the system controller 129.

More specifically, the reverberation characteristic analyzer 127C of the embodiment calculates the ratio of the amplitude level which attenuates with time of the reverberation component with respect to that of a direct component which directly arrives at the listening position on the sound-collected signals collected by the microphones M of the microphone array 140. At the time of calculating the amplitude level ratio of the reverberation component, the reverberation characteristic analyzer 127C calculates the preset distance between one microphone M and another microphone M in the microphone array 140, that is, the reverberation characteristic at each of predetermined angles in the listening position on the basis of the distance between the microphones M in the microphone array 140.

Usually, at the listening position, in the case of using a linear array in which the microphones M of the microphone array 140 are arranged on the plane parallel with the floor surface of the listening room 10 in a direction perpendicular to the front surface of the listening room 10, that is, the radial axis of the center speaker 131, when amplified sound is reflected by a wall surface or the like of the listening room and the reflected amplified sound reaches the listening position from a predetermined direction, amplified sound (hereinafter, referred to as reverberation component) having a predetermined delay from amplified sound (hereinafter, referred to as direct component (direct sound)) directly reached the listening position from the speaker system 130, and having a predetermine angle (θ) with respect to the front surface is collected by the microphone M. Therefore, in the amplified sound reflected by the wall surface of the listening room 10, which is recognized by the microphone M, an amplitude difference of the reach time and the sound pressure level occurs on the basis of the arrival direction in the microphone M as a reverberation component.

For example, as shown in FIG. 10, when the amplified sound entering from a direction A having a predetermined angle (θ) from the radial axis of the center speaker 131 and reflected by the wall surface arrives as a reverberation component at the microphone array 140, an arrival time difference (dt) occurs with respect to the direct component, and a predetermined phase difference occurs in each of the frequencies included in the amplified sound due to the arrival time difference.

In the embodiment, the reverberation characteristic analyzer 127C can analyze the reverberation characteristic including the direction characteristic of the amplified sound in the listening position by performing a predetermined delay process on a plurality of sound-collected signals in the microphones M and adding the sound-collected signals subjected to the delay process.

Specifically, in the embodiment, when a reverberation component included in amplified sound has a predetermined angle with respect to the radial axis of the center speaker 131 as a reference in the listening position, in the reverberation component, the arrival time difference (dt) from the arrival time of the direct component which directly arrived from the center speaker 131 and the phase difference due to the arrival time difference occur. Therefore, the reverberation characteristic analyzer 127C of the invention performs the delay process using a delay amount expected on the basis of the arrival direction in which each of the sound-collected signals is to be analyzed, adds the sound-collected signals subjected to the delay process and, on the basis of the result of the addition, recognizes the reverberation characteristic in each of the arrival directions in which a sound-collected signal is to be analyzed. As a result, by performing the process in all of the arrival directions in which the sound-collected signals are to be analyzed, the reverberation characteristic analyzer 127C can analyze the reverberation characteristic including the direction characteristic of amplified sound including the reverberation component.

Specifically, in the embodiment, the distance from the speaker system 130 to the listening position, for example, the distance from the center speaker 131 to the center of the microphone array 140 is preset. The reverberation characteristic analyzer 127C calculates delay time in each of the sound-collected signals on the basis of the arrangement positions of the microphones M by using the center of the listening position as a reference, that is, the center microphone M as a reference in each of the angles of the preset arrival directions, delays the sound-collected signals, and adds the delayed sound-collected signals in each of the angles of the preset arrival directions, thereby analyzing the reverberation characteristic in each of the arrival directions with respect to the listening position.

For example, in the embodiment, the arrival direction in which the analysis is to be made is preset every 30 degrees using the radial axis of the center speaker 131 as a reference. On the basis of the arrangement position of each of the microphones M in the microphone array 140, the reverberation characteristic analyzer 127C calculates a delay amount in each of the arrival directions in which the analysis is to be made and stores the delay amount on the inside. The reverberation characteristic analyzer 127C puts the preliminarily calculated delay on each of sound-collected signals collected by the microphones M in each of the predetermined arrival directions and adds the sound-collected signals, thereby calculating a piece of data (hereinafter, referred to as measurement data) every predetermined arrival direction. On the basis of the measurement data in each of the predetermined arrival directions, the reverberation characteristic analyzer 127C calculates the reverberation characteristic every predetermined arrival direction, for example, reverberation time indicative of time in which the amplitude level drops to −60 dB when the direct component is used as a reference, the energy distribution of each reverberation component, the time characteristic of energy of each of the reverberation components, and the like.

The spatial characteristic analyzer 127 of the embodiment presets predetermined weights in correspondence with the arrangement of the microphones M. On the basis of sound-collected signals collected by the microphones M, the spatial characteristic analyzer 127 adds the sound-collected signals collected by the microphone array 140 on the basis of the set weights. For example, by decreasing the weight on the sound-collected signals collected by the microphones M arranged, with distance from the center of the listening position, further, the arrival direction of the reverberation component can be recognized accurately. Consequently, the reverberation characteristic including the arrival directions of the reverberation components can be analyzed accurately.

The reverberation characteristic analyzer 127C compares the reverberation characteristic including the arrival direction of the reverberation component with a desired reverberation characteristic, for example, a reverberation characteristic which is set via the operating unit 128. As a result, each of the signal process controllers 260 calculates a reverberation parameter for calculating a coefficient which is used when the reverberation component is to be added in the reverberation control circuit 250.

Specifically, the reverberation characteristic analyzer 127C calculates a reverberation parameter for calculating a reverberation control coefficient necessary when the reverberation component is controlled in the reverberation control circuit 250 in the signal process controller 260. The reverberation characteristic analyzer 127C calculates a reverberation parameter including a parameter for generating a reverberation component indicative of the direction characteristic.

Figure 11:
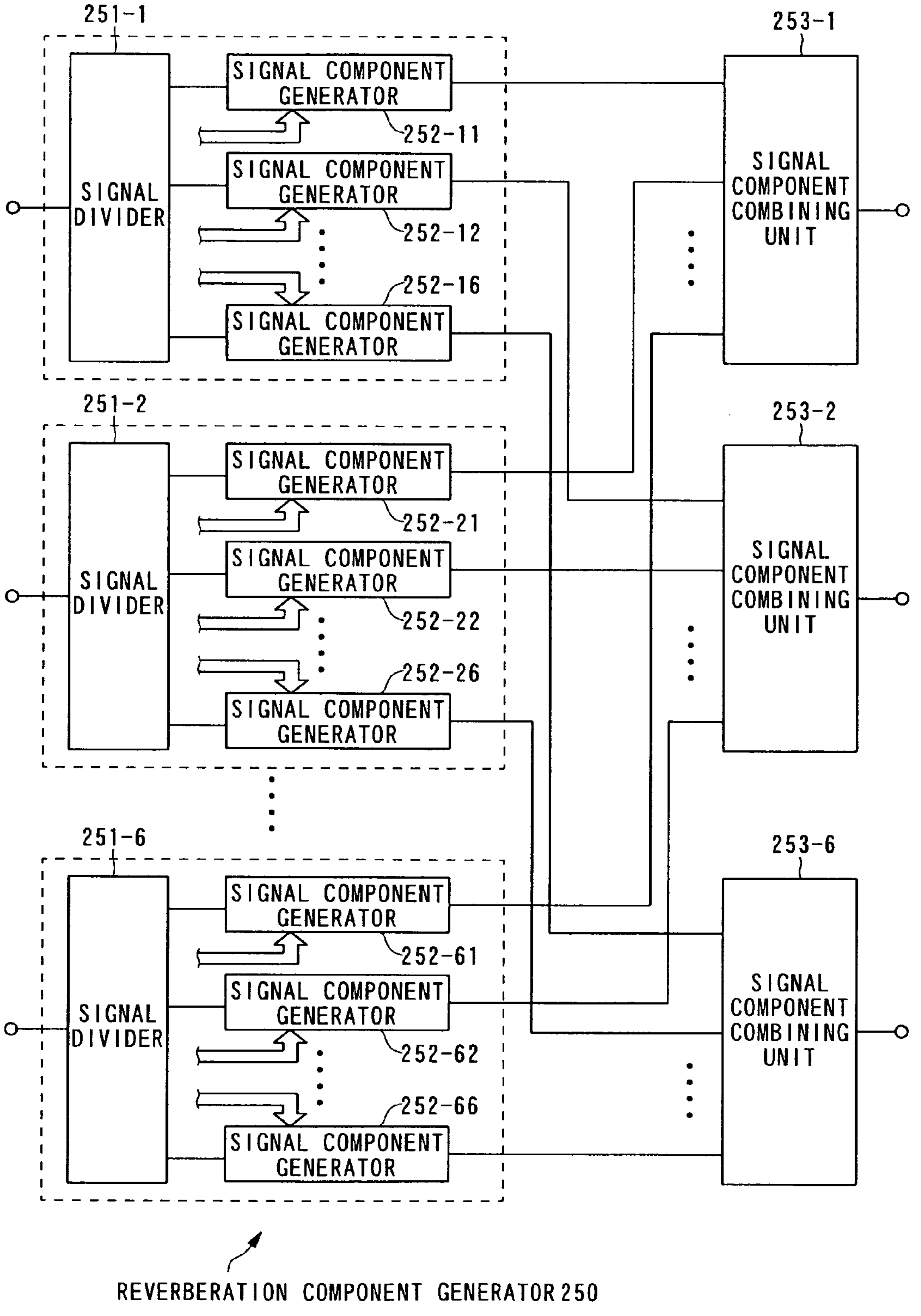
FIG. 11 is a block diagram showing the configuration of reverberation control circuit of the signal processor in the embodiment.

Next, the configuration and operation of the reverberation control circuit 250 in the embodiment will be described with reference to FIG. 11. FIG. 11 is a block diagram showing the configuration of the reverberation control circuit 250 in the signal processor 200 in the embodiment.

To the reverberation control circuit 250, the audio signal of each channel or test signal subjected to the signal level adjustment is input. When the audio signal or test signal is input, the reverberation control circuit 250 divides the input audio signal or test signal into signals of the same number as the number of speakers in the speaker system 130. On the basis of the reverberation control coefficient which is set by the signal process controller 260, the reverberation control circuit 250 performs reverberation component adjustment of generating and adding a reverberation component on each of the divided signals of the audio signal or test signal (hereinafter, referred to as divided signal), adds the resultant signals on the channel unit basis, that is, on the output channel basis of each speaker, and outputs the added signal of each channel to the corresponding D/A converter 122.

Specifically, the reverberation control circuit 250 has, as shown in FIG. 11, a signal divider 251, a signal component generator 252, and a signal component combining unit 253. The signal divider 251 divides the input audio signal or test signal by the same number as that of the speakers of the speaker system 130. When the reverberation control coefficient is set by the signal process controller 260 and the audio signal or test signal is input, the signal component generator 252 generates a reverberation component every divided signal on the basis of the set reverberation control coefficient and adds the generated reverberation component to the input original divided signal. The signal component combining unit 253 combines the divided signals to which the reverberation components are added for each of the speaker systems.

The signal component generator 252 adds the reverberation component every preset frequency band, and the reverberation control coefficient which is set in the signal component generator 252 is set every channel, every frequency band, and every speaker system as described above.

The signal divider 251 is provided for each channel. To the signal divider 252, the audio signal or test signal output from the signal level adjuster 240 is input on the channel unit basis. When the audio signal or test signal is input, the signal divider 251 divides the input audio signal or test signal of each channel into a plurality of signals having the same component and of the same number as that of the speakers on the channel unit basis, and outputs the divided signals to the signal component generators 252.

For example, in the embodiment, the signal divider 251 divides the input audio signal or test signal of each channel by "6" which is the number of the speaker systems, and outputs the divided signals to the signal component generators 252. That is, the signal divider 251 of the embodiment outputs the divided signals to the signal component generators 252 for the channels and for the speaker systems.

The signal component generators 252 are provided for the respective channels and for the respective speaker systems. In each of the signal component generators 252, the reverberation control coefficient calculated as described above is set for each channel and for each speaker system by the signal process controller 260. To the signal component generators 252, a plurality of divided signals are input on the channel unit basis. When the corresponding divided signal is input, the signal component generator 252 generates a reverberation component, adds the reverberation component to the input divided signal, and outputs the resultant signal to the signal component combining unit 253 in the corresponding speaker system.

Specifically, in the signal component generator 252, a reverberation control coefficient is preliminarily set for each channel, each frequency band, and each speaker system by the signal process controller 260. The signal component generator 252 performs a delay process on the input divided signal on the basis of the reverberation control coefficient.

For example, in the embodiment, each of the signal component generators 252 performs a filter process using an FIR (Finite Impulse Response) filter every frequency band and every speaker system. On the basis of the reverberation control coefficient, that is, the filter coefficient set by the signal process controller 260, at the time of amplifying input divided signals to the speakers, a reverberation component is generated and added so that the reverberation time becomes desired reverberation time in the listening room 10.

The signal component combining units 253 are provided for the speaker systems. To each of the signal component combining units 253, the plurality of divided signals to which the reverberation component outputs from the corresponding signal component generators 252 are added are input. Each of the signal component combining units 253 adds the input divided signals for the corresponding speaker system, thereby generating a signal for each speaker system (hereinafter, referred to as a speaker signal). The signal component combining unit 253 outputs the generated speaker signal to the corresponding D/A converter 122.

Figure 12:
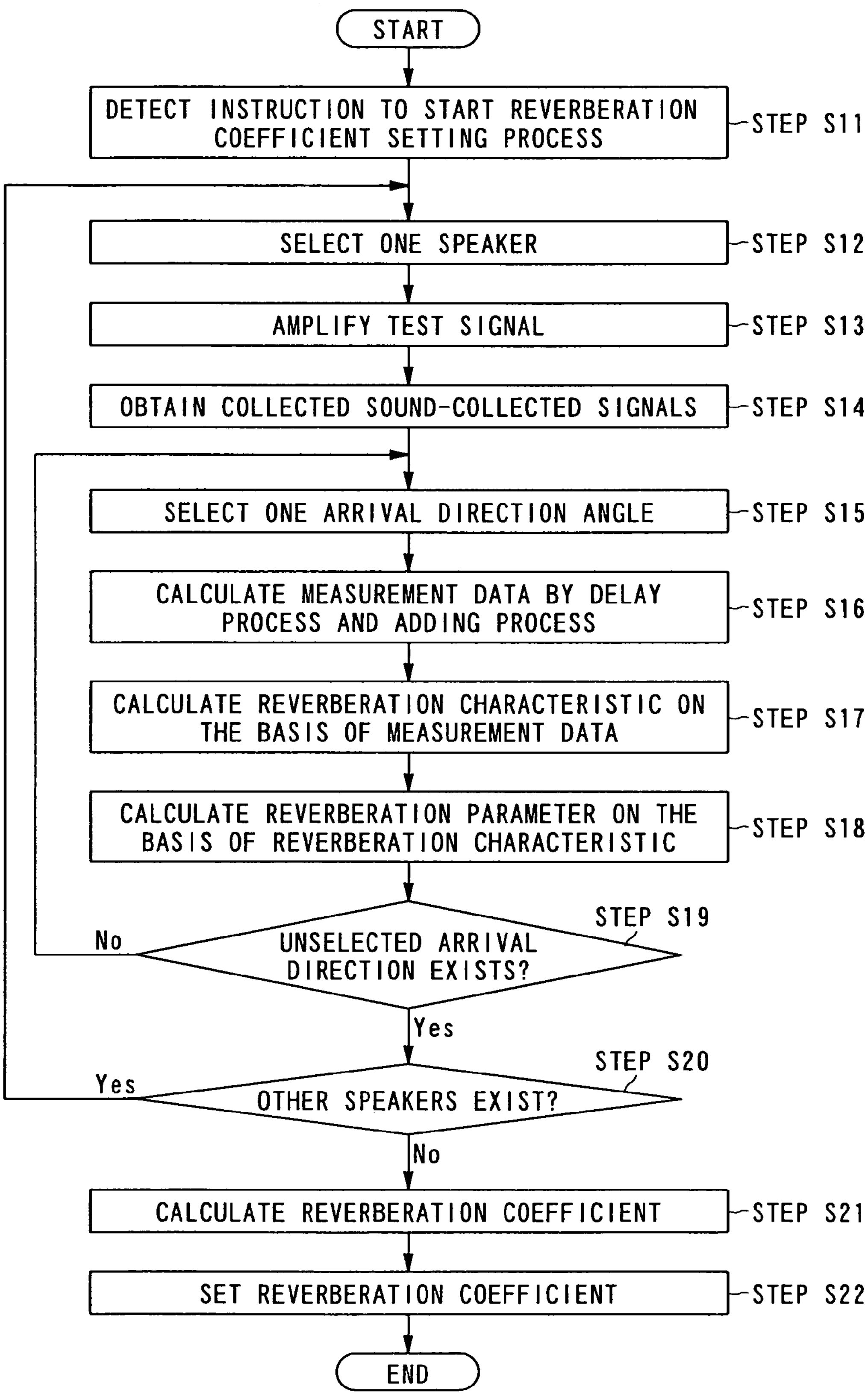
FIG. 12 is a flowchart showing operations of process for setting a reverberation control coefficient in a system controller in the embodiment.

Next, the operations in the reverberation characteristic analyzing process of the embodiment and the reverberation control coefficient setting process based on the reverberation characteristic analyzing process will be described with reference to FIG. 12. FIG. 12 is a flowchart showing operations of the reverberation characteristic analyzing process of the embodiment and the reverberation control coefficient setting process based on the reverberation characteristic analyzing process.

First, when the system controller 129 detects an instruction to start the reverberation characteristic analyzing process and the reverberation control coefficient setting process from the user via the operating unit 128 (step S11), the system controller 129 selects one speaker whose reverberation characteristic has not been analyzed and in which the reverberation control coefficient has not been set (step S12).

After that, the system controller 129 makes the test signal generator 124 generate a predetermined test signal and output the test signal from the selected speaker (step S13). Specifically, the system controller 129 controls the signal process control to stop outputting the signal level in the power amplifier 123 or stop outputting of the other speakers which are not selected such as inhibition of an input in the signal processor 200, and start outputting the test signal from the selected speaker.

Subsequently, the system controller 129 makes the test signal output from the selected speaker and the amplified sound from the speakers are collected by the microphone array 140. The system controller 129 makes the spatial characteristic analyzer 127 obtain the collected amplified sound as sound-collected signals via the microphone amplifier 125 and the A/D converter 126 (step S14).

The spatial characteristic analyzer 127 temporarily internally stores the obtained sound-collected signals. It is sufficient for the system controller 129 to make the spatial characteristic analyzer 127 obtain each sound-collected signal once. Alternatively, to improve the S/N ratio, the system controller 129 may repeat the operation a plurality of times to thereby obtain a plurality of sound-collected signals. In this case, prior to a reverberation characteristic analysis which will be described later, the spatial characteristic analyzer 127 averages the obtained sound-collected signals for each of the microphones M, thereby calculating a sound-collected signal as the base of the analysis.

Subsequently, the system controller 129 selects one preset arrival direction angle which has not been selected yet, and executes the following process (step S15). In the embodiment, as described above, the system controller 129 executes the following process every 30 degrees by using the radial axis of the center speaker 131 as a reference.

First, the system controller 129 makes the spatial characteristic analyzer 127 perform a delay process of delaying a sound-collected signal collected by each of the microphones M in the microphone array 140 on the basis of a delay amount in the selected arrival direction angle, and adds the sound-collected signals subjected to the delay process to calculate one measurement data (step S16).

Specifically, as described above, the spatial characteristic analyzer 127 reads out the delay amount corresponding to the microphone M which is internally calculated in advance on the inside, performs a delay process on the collected signal on the basis of the read delay amount, and adds sound-collected signals subjected to the delay process.

Subsequently, the system controller 129 calculates the reverberation characteristic in the arrival direction on the basis of measurement data calculated by the spatial characteristic analyzer 127 (step S17) and, on the basis of the calculated reverberation characteristic, calculates the reverberation parameter (step S18).

Specifically, the spatial characteristic analyzer 127 of the embodiment calculates the time characteristic of the energy of the reverberation component on the basis of the calculated measurement data, and calculates the calculated time characteristic of the energy as the reverberation parameter in the arrival direction.

Subsequently, the system controller 129 determines whether or not there is an unselected arrival direction angle in which the reverberation parameter is to be calculated (step S19). In the case where there is an unselected arrival direction angle in which the reverberation parameter is to be calculated, the system controller 129 returns to the process of step S15. In the case where there is no unselected arrival direction in which the reverberation parameter is to be calculated, the system controller 129 determines whether or not there is a speaker in which the analysis of the reverberation characteristic and setting of the reverberation parameter has not been performed yet (step S20).

In the case where the system controller 129 determines there is a speaker in which the analysis of the reverberation characteristic and setting of the reverberation parameter has not been performed yet, the system controller 129 returns to the process of step S12.

On the other hand, in the case where the system controller 129 determines that the analysis of the reverberation characteristic and the calculation of the reverberation control parameter has been finished in all of the speakers, the system controller 129 makes the spatial characteristic analyzer 127 output the calculated reverberation parameters to the signal process controller 260, and makes the signal process controller 260 calculate reverberation control coefficients on the basis of the reverberation parameters (step S21).

Finally, the system controller 129 makes the signal process controller 260 set the calculated reverberation control coefficients in the reverberation control circuit 250 (step S22) and finishes the operation.

After that, when sound source is reproduced from the sound source output apparatus 110 and an audio signal is input to the signal processing apparatus 120, in the reverberation addition component generator, the signal process is performed on the audio signal on the basis of the reverberation control coefficient which is set as described above. Specifically, the reverberation characteristic of the audio signal is adjusted, and the audio signal subjected to the signal process is amplified and output from the speaker system 130.

As described above, according to the embodiment, the surround system 100 of the embodiment has: the speaker system 130 installed in the listening room 10 and constructed by the plurality of speakers; the signal processing apparatus 120 for recognizing a reverberation characteristic of the listening room 10 by outputting the audio signal from the speaker system 130 and, on the basis of the recognized reverberation characteristic, adjusting a reverberation component in the audio signal output from the speaker system 130; and the microphone array 140 constructed by the plurality of microphones M disposed in the listening room 10 and having the same characteristics, in which the distances among the microphones M are preliminarily determined and, when an audio signal is output from the speaker system 130 to the listening room 10, for collecting the amplified sound in a specific listening position in the listening room 10. The signal processing apparatus 120 has: the input processor 121 for obtaining a sound signal as an audio signal; the test signal generator 124 for generating, as an audio signal, a test signal used for analyzing a reverberation characteristic of the listening room 10; the power amplifier 123 for amplifying at least one of the sound signal and the test signal and outputting the amplified signal from the speaker system 130; the spatial characteristic analyzer 127 for obtaining, as an amplified sound signal, the amplified sound collected by the microphone array 140 and, on the basis of the obtained amplified sound signal, recognizing a reverberation characteristic having the direction characteristic indicative of the arrival direction of a reverberation component of the amplified sound in the listening position and indicative of attenuation with time in the listening room 10 on the intensity of sound in the listening position of the amplified sound; and the reverberation control circuit 250 for adjusting the reverberation characteristic of the audio signal to be amplified and output from an obtained speaker on the basis of the recognized reverberation characteristic.

With the configuration, the surround system 100 of the embodiment obtains, as the amplified sound signal, the amplified sound collected by the microphone array 140 constructed by the plurality of microphones M having the same characteristic and in which the distances among the microphones M are preliminarily determined and, on the basis of the obtained amplified sound signal, recognizes a reverberation characteristic having the direction characteristic indicative of the arrival direction of a reverberation component of the amplified sound in the listening position in the listening room 10 and indicative of attenuation with time in the listening room 10 on the intensity of sound in the listening position of the amplified sound. The surround system 100 of the embodiment adjusts the reverberation characteristic of sound source to be amplified and output from the obtained speaker on the basis of the recognized reverberation characteristic.

Therefore, at the time of recognizing the reverberation characteristic of each amplified sound, the surround system 100 of the embodiment can also recognize the arrival direction of the reverberation component. Consequently, the reverberation characteristic at the time of amplifying sound source from a CD, DVD, or the like and outputting the amplified sound from the speaker system 130 can be adjusted on the basis of reverberation characteristic in the listening room 10 including the arrival direction of the reverberation component. As a result, the surround system 100 can provide a sound field which is more natural and having higher realistic sensation on the basis of the analyzed reverberation characteristic.

In addition, in the surround system 100 of the embodiment, the spatial characteristic analyzer 127 recognizes a reverberation characteristic having a direction characteristic of a reverberation component on the basis of a phase difference in sound-collected signals collected by the microphone array 140, on the basis of the sound-collected signals collected by the microphones M.

Therefore, the surround system 100 of the embodiment can estimate the arrival direction of the reverberation component accurately. At the time of analyzing a reverberation characteristic on reproduction of sound source, the surround system 100 can accurately analyze the reverberation characteristic including the arrival direction of the reverberation component, and can provide a sound field which is more natural and has higher realistic sensation on the basis of the analyzed reverberation characteristic.

In the surround system 100 of the embodiment, the spatial characteristic analyzer 127 pre-sets predetermined weights in correspondence with the arrangement of the microphones M, and recognizes a reverberation characteristic having a direction characteristic of a reverberation component on the basis of the phase differences among sound-collected signals collected by the microphones M and the set weights.

With the configuration, the surround system 100 of the embodiment can more accurately recognize the arrival direction of the reverberation component by decreasing the weight on the sound-collected signal collected by the disposed microphones M with distance from the center of the listening position. Thus, the reverberation characteristic including the arrival direction of the reverberation component can be analyzed accurately.

In the surround system 100 of the embodiment, the microphone array 140 is constructed by the plurality of microphones M arranged on the surface parallel with the floor surface of the listening room 10. The surround system 100 of the embodiment is constructed by the first array in which the plurality of microphones M are arranged in the same direction as the amplification direction of amplified sound recognized when amplified sound is output from the plurality of speakers to the listening room 10, and the second array in which the plurality of microphones Mare arranged in parallel on the surface orthogonal to the surface on which the first array is disposed. In the surround system 100 of the embodiment, the microphone array 140 has a polygonal shape in which the plurality of microphones are arranged on the surface parallel with the floor surface of the listening room 10 by using the center of the listening position as a reference. In the embodiment, the microphone array 140 is constructed as described above, so that the arrival direction of the reverberation component can be estimated accurately.

In the foregoing embodiment, the process of setting the reverberation time by using the 5.1 ch surround system 100 is described. Obviously, the invention can be also applied to other sound reproducing apparatuses such as a multi-channel system having 7.1 ch or more channels or a stereo sound reproducing apparatus like an AV amplifier.

In the embodiment, the signal processing apparatus 120 performs the reverberation control and the other signal processes on the basis of a digital signal output from the sound source output apparatus 110. Obviously, the signal processing apparatus 120 can perform the signal processes on the basis of an analog signal output from the sound source output apparatus 110 or an analog signal input from the outside.

In the embodiment, the microphone array 140 is constructed by the microphones M having the same characteristic. The microphone array may be constructed by directional microphones having directivity in a predetermined direction with respect to the microphones. A sound-collected signal may be corrected every predetermined angle by changing the direction of one directional microphone.

In this case, the reverberation characteristic analyzer 127C calculates a reverberation parameter using, as measurement data, a sound-collected signal as it is without being subjected to the delay process and the adding process. Therefore, in this case as well, at the time of recognizing a reverberation characteristic of amplified sound, the arrival direction of the reverberation component can be also recognized. Thus, a sound field which is more natural and having higher realistic sensation can be provided on the basis of the analyzed reverberation characteristic.

In the microphone array 140 of the embodiment, the plurality of microphones M are arranged on the surface parallel with the floor surface of the listening room 10. Obviously, it is also possible to dispose a plurality of microphones M on the parallel surface and dispose a plurality of microphones also on the surface orthogonal to the floor surface of the listening room 10, thereby three-dimensionally analyzing the reverberation characteristic of amplified sound including the reverberation component of the listening room 10.

In the embodiment, the spatial characteristic analyzer 1270 analyzes the reverberation characteristic of the two-dimensional plane in the listening room 10, that is, the characteristic of the two-dimensional reverberation component in the same plane as the floor surface of the listening room 10. Obviously, the reverberation characteristic of the listening room 10 may be also three-dimensionally analyzed by disposing the microphone array 140 three-dimensionally to form, for example, a rectangular parallelepiped array in place of the square array.

In this case, the signal process controller 260 calculates a reverberation control coefficient for three-dimensionally generating the reverberation components and sets the calculated reverberation control coefficient in the reverberation control circuits 250.

The entire disclosures of Japanese Patent Applications No. 2004-198295 filed on Jul. 5, 2004 including the specification, claims, drawings and summary are incorporated herein by reference in its entirety.

The invention claimed is:

1. A sound reproducing system comprising:

a speaker system constructed by a plurality of speakers disposed in a sound field space;

a reverberation adjusting apparatus for recognizing a reverberation characteristic in the sound field space by amplifying a sound source by the speaker system and, on the basis of the recognized reverberation characteristic, adjusting a reverberation component in the sound source which is output from the speaker system; and a microphone array which is constructed by a plurality of microphones respectively disposed on a surface parallel with a floor surface of the sound field space and having the same characteristics, in which distances among the microphones are preliminarily determined and, when the sound source is amplified and the amplified sound is output from the speaker system to the sound field space, for collecting the amplified sound in a specific listening position in the sound field space, wherein the reverberation adjusting apparatus comprises:

a first obtaining device which obtains a sound signal as the sound source;

a generating device which generates, as the sound source, a test signal used for analyzing a reverberation characteristic of the sound field space;

an output control device which amplifies at least one of the sound signal and the test signal and outputting the amplified signal from the speaker system;

a second obtaining device which obtains, as an amplified sound signal, an amplified sound collected by the microphone array;

a recognizing device which recognizes a reverberation characteristic having a direction characteristic indicative of an arrival direction of a reverberation component of amplified sound in the listening position on the basis of the obtained amplified sound signal, and indicative of attenuation with time in the sound field space on intensity of sound in the listening position of the amplified sound; and an adjusting device which adjusts the reverberation characteristic of the sound source to be amplified and output from the obtained speaker on the basis of the recognized reverberation characteristic.

2. The sound reproducing system according to claim 1, wherein the microphone array comprises:

a first array in which the plurality of microphones are arranged on a surface having the same direction as the amplification direction of amplified sound recognized when amplified sound is output from the plurality of speakers to the sound field space; and a second array in which the plurality of microphones are arranged in parallel in an axial direction orthogonal to the surface on which the first array is disposed.

3. The sound reproducing system according to claim 1, wherein the microphone array has a polygonal shape in which the plurality of microphones are arranged on the surface parallel with the floor surface of the sound field space using the center of the listening position as a reference.

4. The sound reproducing system according to claim 1, wherein the recognizing device recognizes a reverberation characteristic having a direction characteristic of the reverberation component on the basis of a phase difference in sound-collected signals collected by the microphone array, on the basis of sound-collected signals collected by the microphones.

5. The sound reproducing system according to claim 3, wherein the recognizing device preliminarily sets predetermined weights in correspondence with arrangement of the microphones, and recognizes a reverberation characteristic having a direction characteristic of the reverberation component on the basis of the phase difference in sound-collected signals collected by the microphone array and the set weights.

6. A reverberation adjusting method for adjusting a reverberation component in a sound source output from a speaker system constructed by a plurality of speakers on the basis of a reverberation characteristic of a sound field space to which amplified sound is output from the speaker system, comprising:

a test signal amplifying process for generating a test signal used for analyzing the reverberation characteristic in the sound field space as the sound source, and amplifying the generated test signal by the speaker system;

a sound collecting process for collecting, as an amplified sound signal, the test signal, in a predetermined listening position in the sound field space, output from the speaker system to the sound field space by a microphone array which is constructed by a plurality of microphones respectively disposed on a surface parallel with a floor surface of the sound field space and having the same characteristics, in which distances among the microphones are preliminarily determined;

a recognizing process for recognizing a reverberation characteristic having a direction characteristic indicative of an arrival direction of a reverberation component of amplified sound in the listening position on the basis of the obtained amplified sound signal, and indicative of attenuation with time in the sound field space on intensity of sound in the listening position of the amplified sound; and an adjusting process, at the time of obtaining and amplifying sound source to be amplified by the speaker system, for adjusting the reverberation characteristic of the obtained sound signal on the basis of the recognized reverberation characteristic.

7. A reverberation adjusting apparatus for adjusting a reverberation component in a sound source output from a speaker system constructed by a plurality of speakers on the basis of a reverberation characteristic of a sound field space to which amplified sound is output from the speaker system, comprising:

a first obtaining device for obtaining a sound signal as the sound source in the case of collecting the sound amplified and output to the sound field space by the speaker system in a specific listening position by a microphone array constructed by a plurality of microphones respectively disposed on a surface parallel with a floor surface of the sound field space and having the same characteristics, in which distances among the microphones are preliminarily determined;

a generating device for generating, as the sound source, a test signal used for analyzing a reverberation characteristic of the source field space;

an output control device for amplifying one of the sound signal and the test signal and outputting the amplified signal from the speaker system;

a second obtaining device for obtaining an amplified sound signal collected by the microphone array;

a recognizing device for recognizing a reverberation characteristic having a direction characteristic indicative of an arrival direction of a reverberation component of amplified sound in the listening position on the basis of the obtained amplified sound signal, and indicative of attenuation with time in the sound field space on intensity of sound in the listening position of the amplified sound; and an adjusting device for adjusting the reverberation characteristic of the obtained sound source to be output to the speaker system on the basis of the recognized reverberation characteristic.

* * * * *